US008821960B2

(12) United States Patent
Jackson et al.

(10) Patent No.: US 8,821,960 B2
(45) Date of Patent: Sep. 2, 2014

(54) APPARATUS FOR SLOT DIE SETUP AND CONTROL DURING COATING

(71) Applicant: Ortho-Clinical Diagnostics, Inc., Raritan, NJ (US)

(72) Inventors: James H. Jackson, Churchville, NY (US); David N. Leader, Rochester, NY (US)

(73) Assignee: Ortho-Clinical Diagnostics, Inc. NY (US)

( * ) Notice: Subject to any disclaimer, the term of this patent is extended or adjusted under 35 U.S.C. 154(b) by 0 days.

(21) Appl. No.: 13/652,857

(22) Filed: Oct. 16, 2012

(65) Prior Publication Data

US 2013/0040045 A1 Feb. 14, 2013

Related U.S. Application Data

(62) Division of application No. 12/820,265, filed on Jun. 22, 2010, now Pat. No. 8,297,221.

(51) Int. Cl.
*B05C 3/12* (2006.01)
*C23C 16/52* (2006.01)

(52) U.S. Cl.
USPC ................................................ 427/8; 118/419

(58) Field of Classification Search
None
See application file for complete search history.

(56) References Cited

U.S. PATENT DOCUMENTS 4,522,678 A 6/1985 Zieke
4,652,329 A 3/1987 Focke
4,808,444 A 2/1989 Yamazaki et al.
5,045,134 A 9/1991 Schenker et al.
5,154,951 A 10/1992 Finnicum et al.
5,277,731 A 1/1994 Krimsky et al.
5,626,888 A 5/1997 Sanze et al.
5,853,482 A 12/1998 Gartmann et al.
5,953,953 A * 9/1999 Allmann et al. ................ 73/159

(Continued)

FOREIGN PATENT DOCUMENTS

GB 2093737 A 9/1982
JP 2005238169 A 9/2005
JP 2007105643 A 4/2007

OTHER PUBLICATIONS

International Search Report 11170774.1-2425/2402091 filed Jul. 12, 2011.

*Primary Examiner* — Dah-Wei Yuan
*Assistant Examiner* — Charles Capozzi
(74) *Attorney, Agent, or Firm* — Todd J. Burns

(57) ABSTRACT

The invention relates generally to an apparatus and method that enables a very accurate initial setup of the coating gap for slot die coater and subsequent control of the coating gap during coating operations such that web splices and web defects do not interrupt the coating process. An highly accurate initial set up is achieved via the use of a tapered or wedge-shaped adjustment member mounted perpendicular to the axis of travel of the coating head where the movement of this tapered or wedge-shaped adjustment member in a direction perpendicular to the axis of travel of the slot die housing adjusts the coating gap in increments on the order of ten microns. Substrate splices and defects are detected prior to reaching the coating position such that a feed-forward controller is able to momentarily retract the coating head both avoiding slot die damage and avoiding interruption of the coating process, yet the apparatus is able to return the coating head, with high precision, to its prior position once the splice or defect has passed.

5 Claims, 7 Drawing Sheets

Feed-Forward Control

(56) References Cited

U.S. PATENT DOCUMENTS

| | | | |
|---|---|---|---|
| 6,576,296 | B1 | 6/2003 | Yapel et al. |
| 6,688,580 | B2 | 2/2004 | Jackson et al. |
| 6,706,315 | B2 | 3/2004 | Trabold et al. |
| 6,863,730 | B2 | 3/2005 | Trabold et al. |
| 2002/0001006 | A1* | 1/2002 | Matsumoto et al. ............ 347/16 |
| 2002/0022092 | A1 | 2/2002 | Yoshida |
| 2003/0054107 | A1 | 3/2003 | Trabold et al. |
| 2003/0080307 | A1 | 5/2003 | Jackson et al. |
| 2003/0157243 | A1 | 8/2003 | Trabold et al. |
| 2005/0232673 | A1* | 10/2005 | Korthauer ................ 400/120.16 |
| 2008/0213471 | A1 | 9/2008 | Oki et al. |

* cited by examiner

PLAN VIEW

SIDE VIEW

BOTTOM VIEW

Feed-Forward Control

Feed-Forward Controller Cam Rotation Position and Coating Gap

| Cam Rotation Position | Coating Gap | Adjustments |
|---|---|---|
| 12:00 or 0° | $Y_1$ = Bead Pickup | Fixed at 0° |
| 3:00 or 90° | $Y_2$ = Coating Position | Adjustable (Typically 40° - 90°) |
| 6:00 or 180° | $Y_3$ = Splice Retract | Adjustable (Typically 120° - 180°) |
| 9:00 or 270° | $Y_4$ = Defect Retract | Fixed at 270° |

Internal Components (with Slide and Other Components not shown)

FIG. 7A
Wedge Details
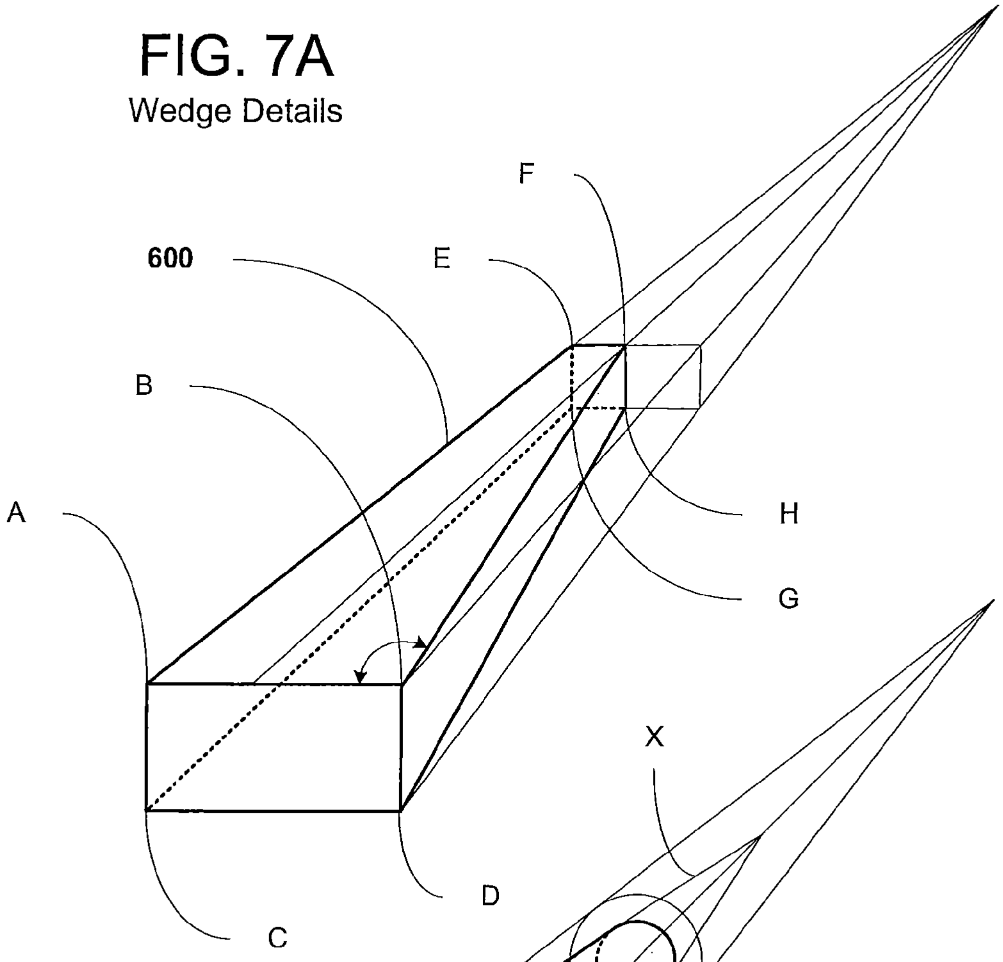
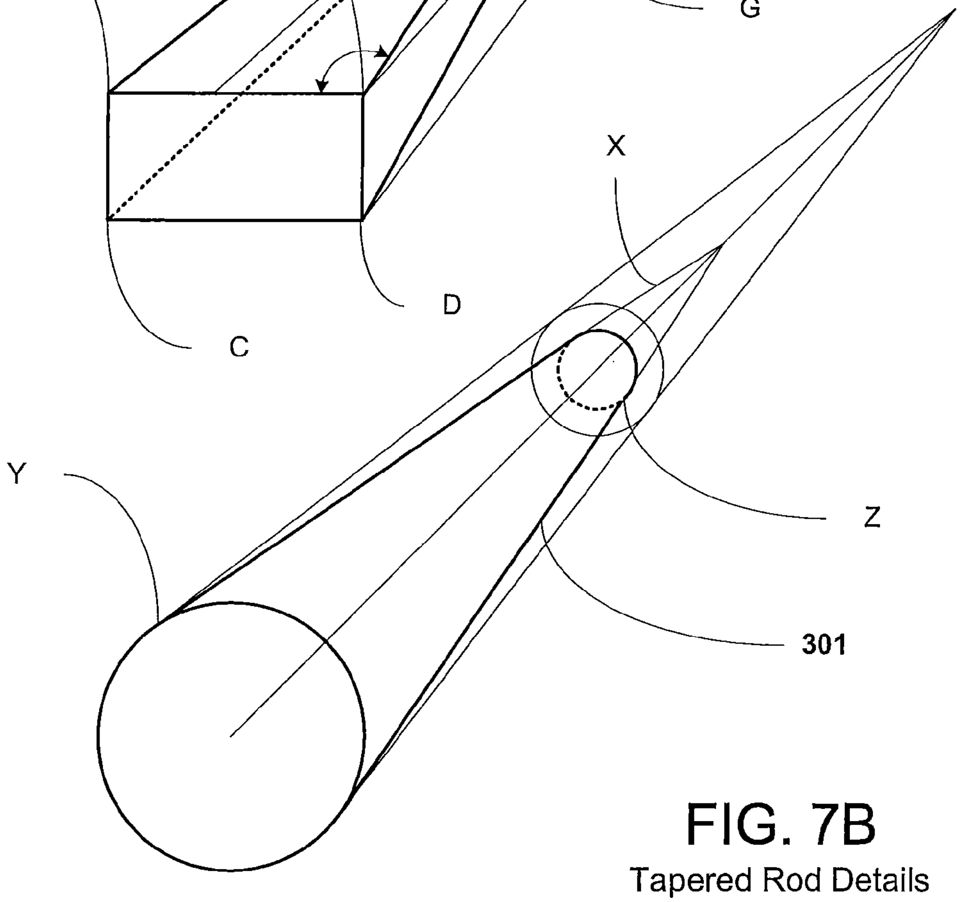
FIG. 7B
Tapered Rod Details

APPARATUS FOR SLOT DIE SETUP AND CONTROL DURING COATING

CROSS REFERENCE TO RELATED APPLICATION

This patent application is a Divisional of the U.S. Non-Provisional application Ser. No. 12/820,265, filed Jun. 22, 2010, the disclosure of which is incorporated by reference in its entirety.

FIELD OF THE INVENTION

The invention relates generally to apparatus and processes that enable an accurate initial setup of the coating gap for slot die coater and subsequent control of the coating gap during coating operations such that interruptions caused by web splices and web defects during the coating process are reduced or even eliminated.

BACKGROUND OF THE INVENTION

The production of high quality articles, particularly photographic, photothermographic, and thermographic articles, consists of applying a thin film of a coating solution onto a continuously moving substrate preferably a continuous web. Thin films can be applied using a variety of techniques including: dip coating, forward and reverse roll coating, wire wound rod coating, blade coating, slot coating, slide coating, and curtain coating. Coatings can be applied as a single layer or as two or more superimposed layers. Although it is most convenient for the substrate to be in the form of a continuous web, it may also be formed of a succession of discrete sheets.

When a web material is continuously fed from a plurality of successive rolls, the ends of the rolls may be spliced together to eliminate interruption to the web feed. Different types of splices can be formed, including a lap splice, a butt splice, and a gap splice. A lap splice is formed when a portion of an expiring web overlies a portion of a web from a new roll with the under surface of the overlapped portion of one of the webs adhering to the upper surface of the other web. With a butt splice, the trailing end of the expiring web is in intimate contact with the leading end of the new web, but no overlap exists. A gap splice is formed when no overlap exists and the ends of the expiring web and new web are separated. For the butt splice and the gap splice, tape may be employed to connect the ends. U.S. Pat. No. 5,277,731 relates to the formation of a butt splice. U.S. Pat. Nos. 4,652,329 and 5,045,134 teach apparatus and methods for forming a splice and are hereby incorporated by reference in their entireties.

The coating gap between the moving web and the coating die is typically less than about 4 millimeters (0.157 inch). Web splices, debris on, or defects in, the web in excess of the coating gap can cause serious damage to the coating die. It is common practice to retract the coating die, and break the coating bead, to permit web splices to pass through the coating gap. After the web splice passes the coating gap, the pick-up cycle must be repeated to reestablish the coating bead.

There are two important capabilities required of machines used to apply the coating solution to a continuous web or a series of discrete sheets. One is the ability to adjust the initial coating gap accurately often measured in microns. Second, is the ability to detect web splices, debris on, or defects in the web where the coating die is momentarily retracted to avoid damage and immediately returned to the exact previous position to resume the coating operation.

Numerous mechanisms and procedures have been proposed to implement one or the other of these two capabilities, as indicated in the following references.

U.S. Pat. No. 4,522,678 discloses that in the manufacture of film containing integral fasteners and the like, the film commonly exits through an elongated slot die while profiles for the fasteners exit through a smaller configured slot located laterally along the film die slot. The fastener profiles normally carry a thickened base so that the profiles will stand without undue tipping for better inter-engagement with one another. It has been found that it is advantageous if the base of the profile can be adjusted transversely of the film slot so that the size of the base can be adjusted on-line. The '678 patent allows the die block to be transversely adjustable by a combination of a U-shaped mounting block, an inverted T-shaped profile plate and an eccentric adjustment pin, assembled in a fashion so that the eccentric pin can be rotated to adjust transversely the gap through which the profile base passes just before joining the film. This device also makes possible measurement of the gap for the profile base indirectly on line.

U.S. Pat. No. 4,808,444 discloses a coating method and apparatus in which a coating composition is applied from a hopper to a web continuously travelling on a backing roller. The backing roller is rapidly moved by a pneumatic mechanism relative to the hopper between positions at which the composition can and cannot be applied to the travelling web in order to avoid thick coating at a leading portion or at a spliced portion of the web.

U.S. Pat. No. 5,154,951 discloses an apparatus and method for bead coating a web with liquid composition with a pressure differential applied across the bead of composition between the lip of the slide hopper and the web. An enclosure is disposed under and open to the bead. Vacuum is applied to the enclosure by a turbine driven by an AC induction motor. Servo means are provided for regulating the speed of the motor and thereby the pressure differential across the bead. The AC motor and the servo means allow the desired pressure to be maintained without surges and allows the differential pressure to be rapidly changed, as for the passage of a splice in the web through the bead.

U.S. Pat. No. 5,626,888 discloses a flat-sheet die for an extrusion system for producing flat sheets has an extremely close succession of actuators, by way of which at least one die lip is adjustable with a narrow-band bending line in order to define the outlet gap.

U.S. Pat. No. 5,853,482 discloses an apparatus and method for applying a coating solution to a running substrate using a slot die having two die lips forming a gap therebetween. The gap also defines an outlet for releasing the coating solution to the substrate. The lips have plurality of manifold chambers communicating with gas feeder and coating solution feeder provided in the die lips. The manifold chambers communicate with the outlet. The width of the coating solution is adjustable with the gas pressure applied to the gas feeder.

U.S. Pat. No. 5,953,953 discloses an apparatus and method for detecting the presence of a splice in a running length of web material, particularly photosensitive web material. The apparatus includes first and second encoders coupled to first and second rollers, respectively. As the web material is transported across the rollers, the speeds of the rollers are continuously and simultaneously detected. The rollers will travel at substantially the same speed when the web is being transported across both rollers. The presence of the splice is detected when the speeds of the two rollers differ.

U.S. Pat. No. 6,576,296 discloses a method and apparatus for continuously coating moving web and splices with a coating fluid. The system includes a slide coating die having a slide surface with at least one feed slot for extruding the coating fluid onto the moving web. The slide coating die defines a coating gap with the moving web. The coating gap is adjustable between a coating position and a splice coating position. A web guide is positioned to guide the moving web in a first direction past the slide coating die such that a coating bead of the coating fluid can be formed in the coating gap. A vacuum system is positioned to generate a reduced pressure condition along a lower surface of the slide coating die. The vacuum system defines a vacuum gap with the moving web. The vacuum gap is adjustable independent of the coating gap between a coating position and a splice coating position. A detector signals an increase in web thickness. A controller is functionally connected to the detector. The controller adjusts the coating gap and the vacuum gap to the splice coating position in response to an increase in web thickness in excess of a predetermined magnitude while maintaining a stable coating bead.

U.S. Pat. No. 6,688,580 discloses a die for dispensing a fluid onto a substrate, wherein the die has an movable lip adjacent a fixed lip to form a die opening therebetween. An actuator is mechanically connected to the movable lip and is operable to automatically move the movable lip with respect to the fixed lip in association with a fluid dispensing process, thereby changing a volume of the die opening. The adjustable die is often a slot die and is used with a fluid dispensing valve having an upstream valve ball. The actuator can be an electromechanical actuator such as a piezoelectric actuator or a fluid operated actuator.

U.S. Pat. No. 6,706,315 discloses a process that includes: providing a moving substrate; applying at least one coating layer wherein the at least one coating is a photoconductive material, an electrically insulating material, a hole transport material, an anti-curl material, or an adhesive material onto the moving substrate with a slot die coater equipped with at least one position sensor mounted on at least one end of the slot die coater, and for example, applying from one to about five coating layers on the substrate; sensing the position of the slot die coater relative to the moving substrate with at least one position sensor; and, when the position of the slot die coater relative to the moving substrate deviates from a set of predetermined coordinates, iteratively adjusting the position of the die coater relative to the surface of the substrate to return to the set of predetermined coordinates.

U.S. Publication No. 2003/0080307 discloses a die for dispensing a fluid onto a substrate, wherein the die has a movable lip adjacent a fixed lip to form a die opening therebetween. An actuator is mechanically connected to the movable lip and is operable to automatically move the movable lip with respect to the fixed lip in association with a fluid dispensing process, thereby changing a volume of the die opening. The adjustable die is often a slot die and is used with a fluid dispensing valve having an upstream valve ball. The actuator can be an electromechanical actuator such as a piezoelectric actuator or a fluid operated actuator.

U.S. Publication No. 2003/0157243, U.S. Publication No. 2003/0054107 and U.S. Pat. No. 6,863,730 disclose an apparatus including: a movement device that moves an object to be coated; a slot die coater equipped with a position sensor mounted on at least one end of the slot die coater and which slot die coater controllably dispenses coating material onto the moving object; and at least one servo motor-controller system in electrical contact with the position sensor, wherein the position sensor senses the position of the slot die coater relative to the object and wherein the at least one servo motor-controller system adjusts the position of the slot die coater relative to the object if the position of the slot die coater relative to the moving substrate deviates from a set of predetermined coordinates.

None of the prior references disclose the ability to simultaneously achieve high accuracy coating gap setup and ability to retract and reposition the slot die with high precision. Likewise, none of the prior references disclose the ability to detect the difference between a substrate splice and a coating defect to subsequently position the slot die at different distances from the substrate to minimize the potential for slot die damage. Furthermore, none of the prior references disclose the use of feed-forward controllers which have the capability to minimize the amount of off-specification coated product.

SUMMARY OF THE INVENTION

An object of the invention is to solve or at least improve upon the deficiencies of prior art described above.

One aspect of the present invention is directed to a coating apparatus comprising, a support device that supports an object to be coated, a coating head, a first support supporting said coating head in a selected position, said first support movable along at least one axis, an adjustment mechanism positioned to move the first support relative to the support device to adjust a gap between said coating head and said object to be coated, a cam positioned to move the first support, and a cam drive for providing rotation to the cam, wherein rotation of the cam adjusts the position of said coating head relative to said object to be coated.

Still, another aspect of the invention is directed to a method of coating an object. The method includes, providing the apparatus described above; actuating the adjustment mechanism to set a coating gap between coating head and the object to be coated, said coating head being in a coating position; applying at least one coating layer onto said moving object with said coating head; actuating the cam drive to rotate the cam whereby rotation of the cam against the first support moves the coating head in a direction away from the object being coated; and actuating the cam drive to return the coating head to said coating position.

In a preferred embodiment, the present invention relates to a coating method and apparatus for coating an object such as discrete sheet or web which enables the setup of a accurate initial coating gap with an adjustment sensitivity on the order of ten microns and allows for continuously coating over gaps or splices in the receiving substrate with a coating fluid without possibility of damage to the coating die.

In another preferred embodiment the invention provides an apparatus such that the initial coating gap can be set very accurately to within about ten microns.

Another preferred embodiment of the invention is to, in addition to enabling a very accurate coating gap setup, allow the coating die to retract from the substrate being coated to allow for the safe passage of coating defects and substrate splices without damage to the slot die and subsequently returning the slot die with high precision to its former coating position.

Another preferred embodiment of the invention is to recognize the difference between splices in the substrate being coated and coating defects in the substrate such that the slot die can be retracted to a greater distance for defects further minimizing the potential for slot die damage.

Still another preferred embodiment of the invention is the use of a feed-forward control mechanism to implement slot die retraction which incorporates a model of the coating process based upon the transport lag of the substrate being coated such that the slot die coater is retracted just as the splice or defect reaches the coating die gap and is returned with high precision to the original coating position just after the splice or defect passes. This minimizes the amount of product produced with a coating thickness unsuitable for sale.

Further objects, features, and advantages of the present application will be apparent to those skilled in the art from detailed consideration of the embodiments that follow.

BRIEF DESCRIPTION OF THE DRAWINGS

FIGS. 7A and 7B are three-dimensional views of the details associated with both the wedge-shaped adjustment member according to one preferred embodiment and the tapered rod adjustment member according to another preferred embodiment.

DETAILED DESCRIPTION OF THE PREFERRED EMBODIMENT

Figure 1:
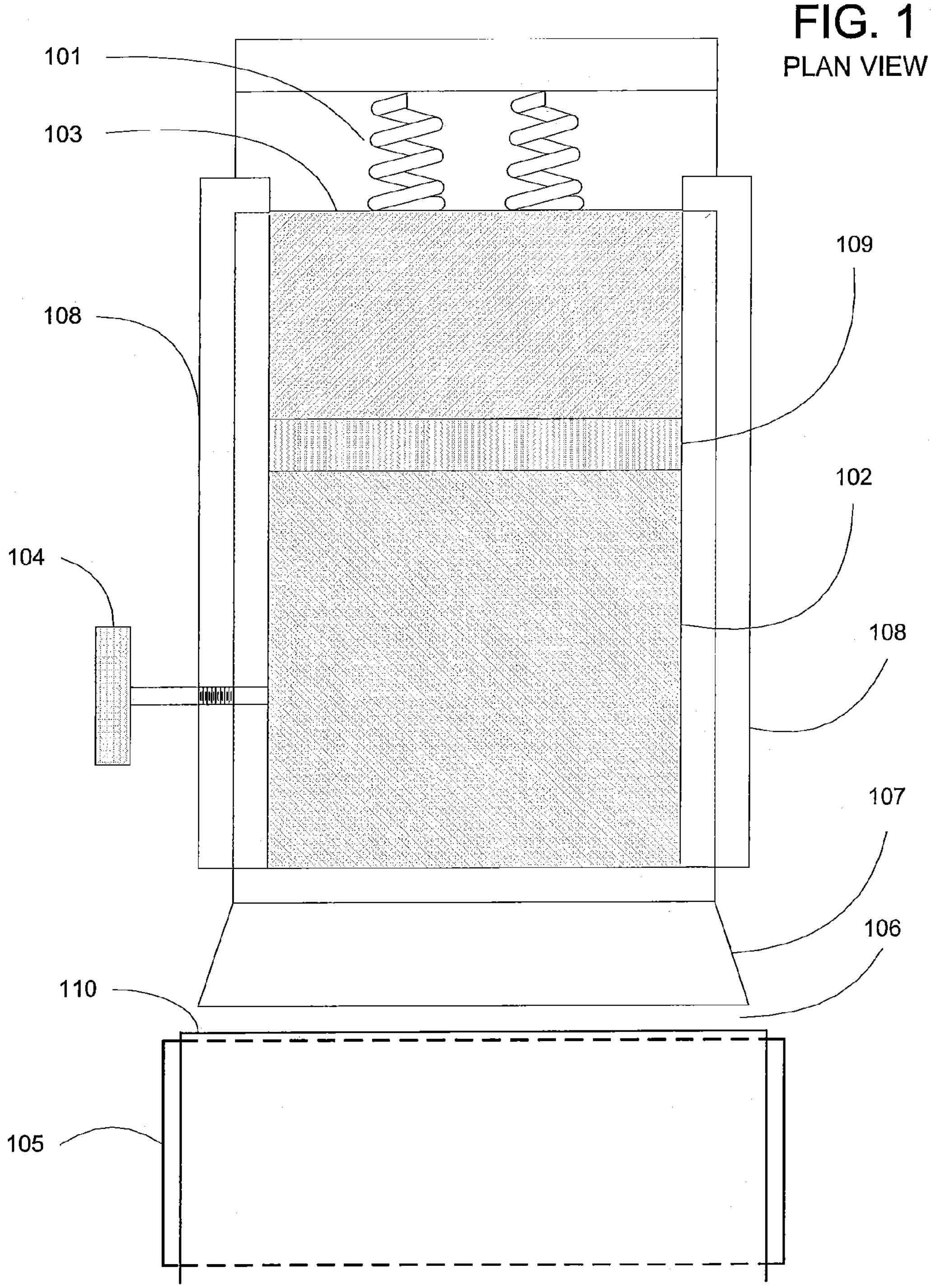
FIG. 1 is a schematic top plan view of the coating apparatus according to a preferred embodiment of the present invention.

While the present invention is described with respect to the preferred embodiment described below and shown in the figures, the present invention is limited only by the metes and bounds of the claims that follow.

The apparatus and methods described herein enable an accurate setting of the initial coating gap in slot die coaters plus the ability for the slot die to retract in the presence of web splices, debris on, or defects in, a discrete or continuous substrate where after retraction the slot die returns with high precision to its former position.

The benefits of the apparatus and methods described herein are the ability to accurately set the initial coating gap and upon retraction of the slot die to avoid damage, the ability to return with high precision to the former coating position hence maintaining the same coating gap.

For a general understanding of the disclosed technology, reference is made to the drawings. In the drawings, like reference numerals have been used to designate identical elements. In describing the disclosed technology, the following term(s) have been used in the description.

The term "backlash" refers herein to clearance between mating components, sometimes described as the amount of lost motion due to clearance or slackness when movement is reversed and contact is re-established. In particular, in a pair of gears, backlash is the amount of clearance between mated gear teeth. In other words it is the difference between the tooth space and the tooth thickness, as measured along the pitch circle. Theoretically, the backlash should be zero, but in actual practice some backlash must be allowed to prevent jamming of the teeth due to tooth errors and thermal expansion. This gap means that when a gear-train is reversed the driving gear must be turned a short distance before all the driven gears start to rotate. Backlash is an unavoidable property of nearly all reversing mechanical couplings.

The term "leadscrew" refers herein to a screw designed to translate rotational motion into linear motion. This is accomplished by the rotation of a threaded rod that has been inserted into a leadscrew nut such that when the threaded rod is rotated the leadscrew nut is moved a specified linear distance (depending upon the pitch of the threads in the rod). Leadscrews exhibit backlash similar to that exhibited by a pair of gears.

The term "accurate" or "accurately" refers herein to a positioning or measurement relating to an absolute value. That is, an accurate measurement of a quantity will be relatively close to its actual (true or desired) numerical value. Preferably an accurate measurement will be one that is within, at most, a few percent of its true value. For the slot die apparatus and method disclosed herein a coating gap accuracy of preferably about 50.00 microns (0. 0019 inches), more preferably about 30.00 microns (0.0011 inches), even more preferably about 20.00 microns (0.00078 inches) and most preferably about 12.7 microns (0.00050 inches) is maintained.

The term "precision" or "precisely" refers herein to the degree that repeated positioning or measurements under unchanged conditions show the same results. Note that while the repeated measures may be numerically very close to each other, the measurements may not be close to the actual (true or desired) numerical value. Preferably a series of precise measurements will be within, at most, a few percent of each other. For the slot die apparatus and method disclosed herein a coating gap precision of preferably about 5.00 microns (0.00019 inches), more preferably about 3.00 microns (0.00011 inches), even more preferably about 2.00 microns (0.000078 inches) and most preferably about 1.27 microns (0.000050 inches) is maintained.

The term "disturbance" refers herein to environmental forces or effects that tend to induce change in a process. Typical disturbances of interest include both web splices and web defects.

The term "feed-forward control" refers herein to a form of control that only requires the detection of an impending process disturbance to initiate corrective action.

One aspect of the invention is directed to a coating apparatus, exemplified herein as a slot die coater. The apparatus includes a support device that supports an object to be coated. The support device is exemplified as coating roller 105 and web 110. The apparatus further includes a coating head, a first support supporting said coating head in a selected position, said first support movable along at least one axis, an adjustment mechanism positioned to move the first support relative to the support device to adjust a gap between said coating head and said object to be coated, a cam positioned to move the first support, and a cam drive for providing rotation to the cam, wherein rotation of the cam adjusts the position of said coating head relative to said object to be coated. In the embodiments described below, these features of the invention are exemplified as follows: the coating head as coating head 107; the first support as the combination of die mount 102, die pivot 109 and machine tool slide 103; adjustment mechanism as manual gap adjustment 104 and tapered rod 301; cam as cam 302; and cam drive as servomotor 200.

The coating apparatus may include a second support supporting the first support, which is exemplified as side rails 108, wherein the first and second supports are movable with respect to each other along the at least one axis.

FIG. 1 is a schematic plan view of the slot die assembly where the slide springs 101 provide tension for the machine tool slide 103 supporting the die pivot 109 and the die mount 102. The coating head 107 is attached to the die mount 102 where the coating gap 106 between the coating head 107 and the coating roller 105 is initially adjusted using the manual gap adjustment 104. The machine tool slide 103, the die pivot 109, the die mount 102 and the coating head 107 all move as an integral unit in the side rail 108.

Figure 2:
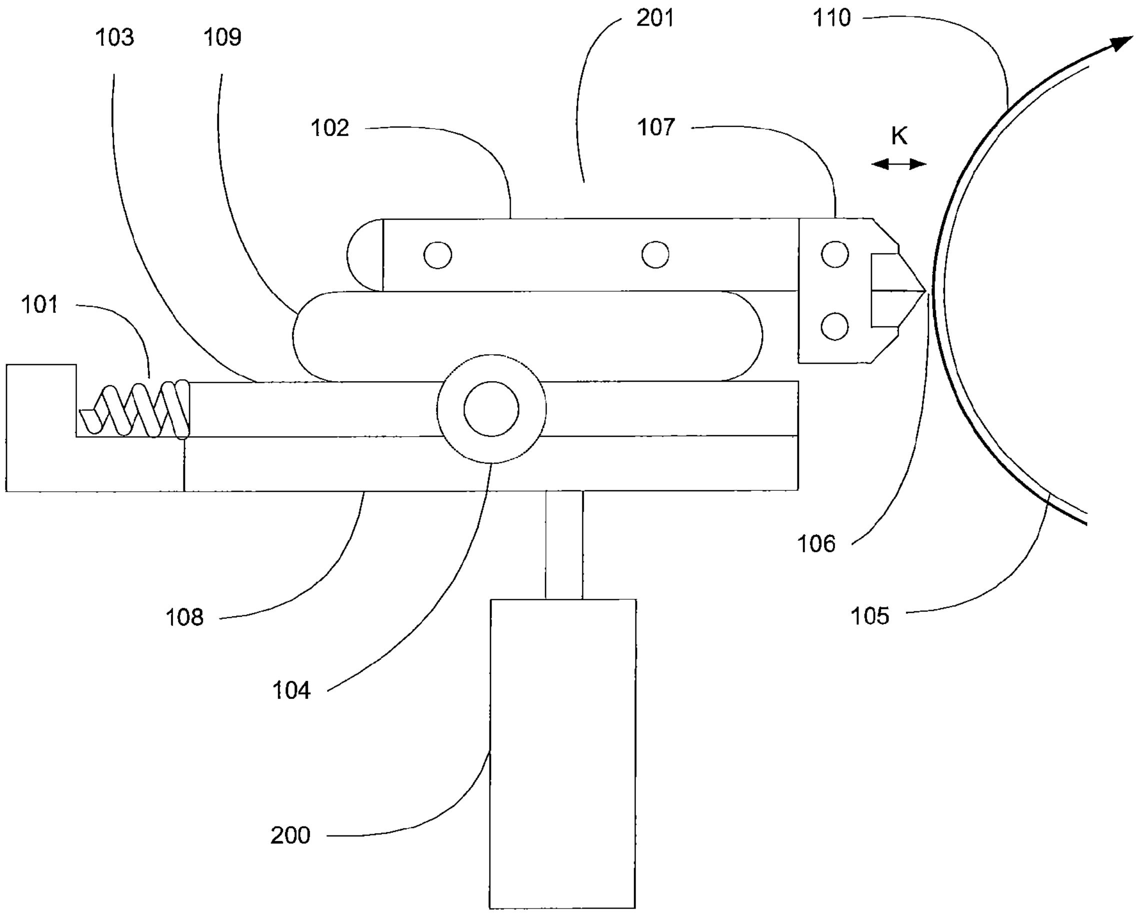
FIG. 2 is a schematic side view of the coating apparatus according to a preferred embodiment of the present invention.

FIG. 2 is a schematic side view of the slot die assembly showing the unit configuration of the machine tool slide 103, the die mount 102, the die pivot 109, the coating head 107 as a single unit 201 and the side rail 108. The directional arrow K shows the axis of movement of the single unit 201. It also shows the position of the servo motor 200 and the manual gap adjustment 104.

Figure 3:
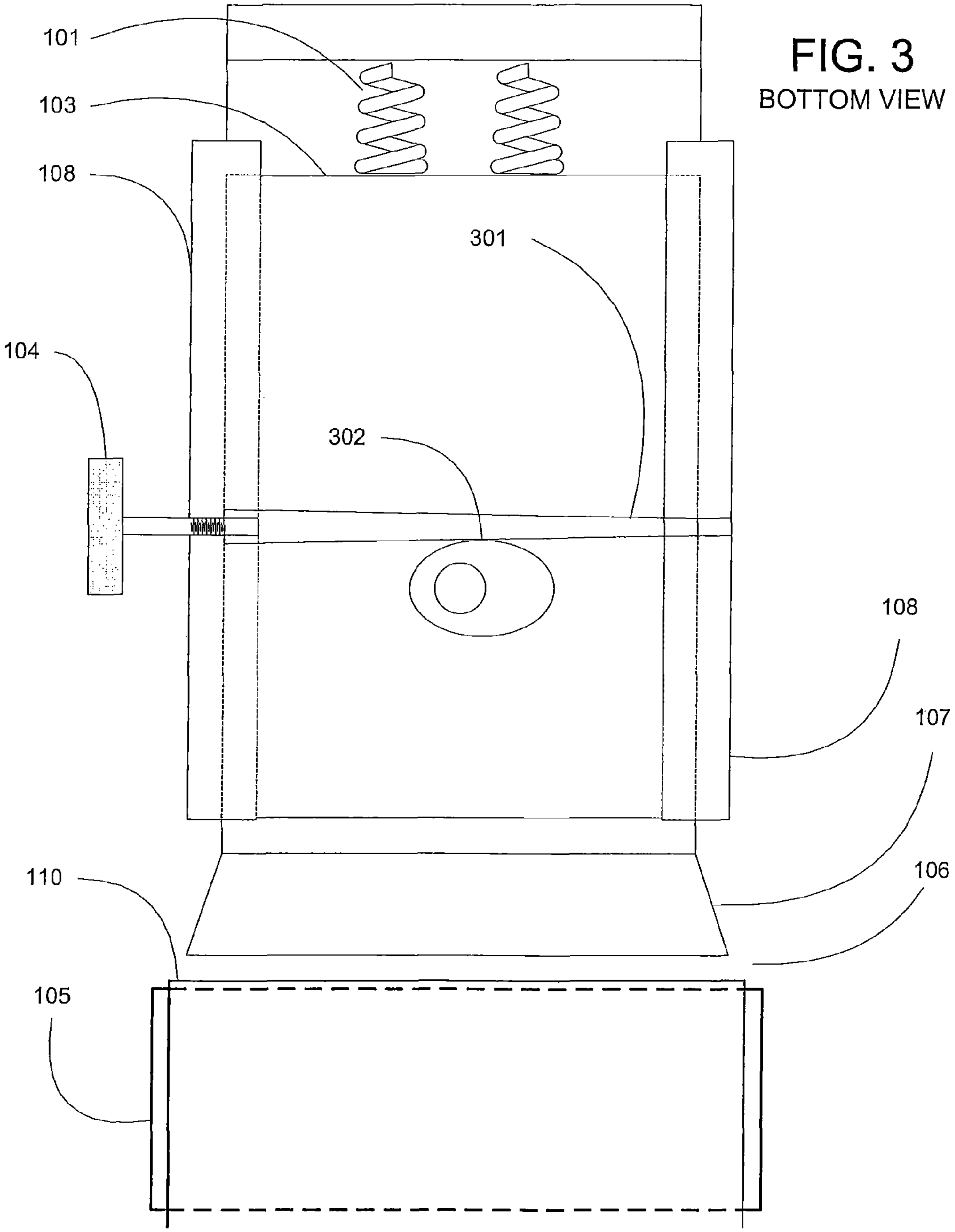
FIG. 3 is a schematic bottom view of the coating apparatus according to a preferred embodiment of the invention.

FIG. 3 is a schematic bottom view of the slot die assembly where the servo motor 200 has been removed to allow a view of the tapered rod 301 and cam 302 which when used in combination with the manual gap adjustment 104 enables setting of the initial coating gap 106.

Figure 4:
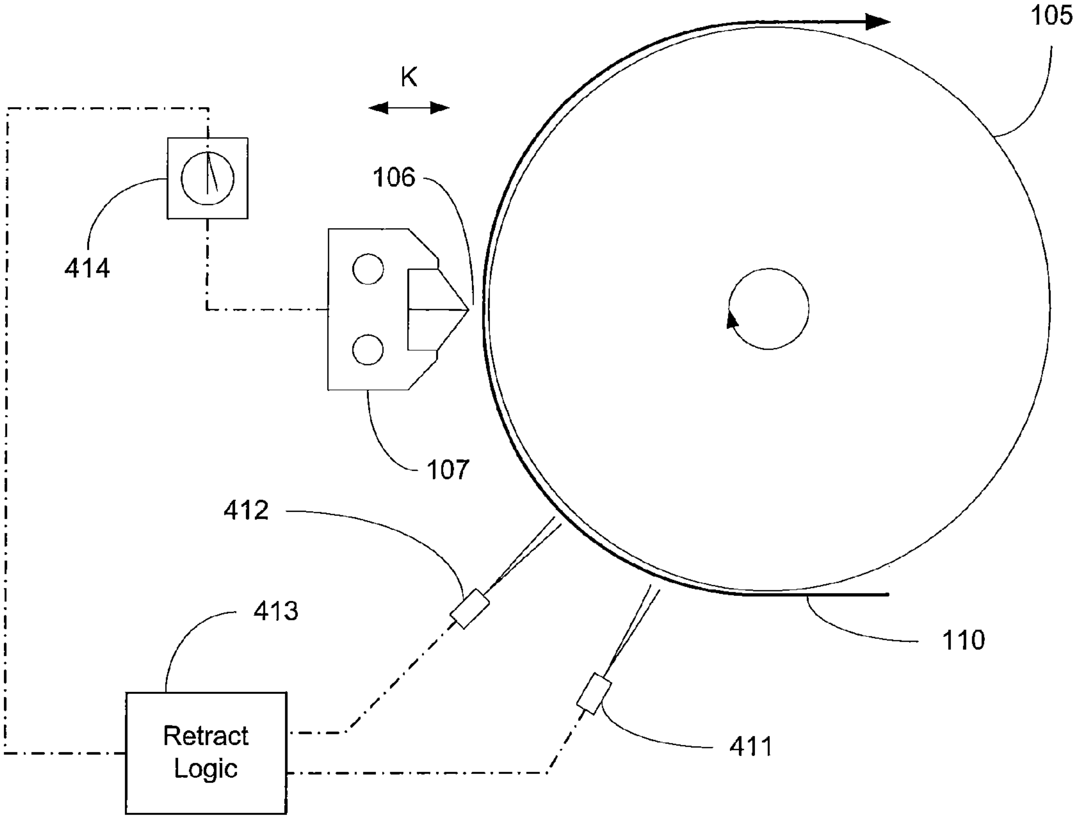
FIG. 4 is a schematic diagram of a control system for controlling the gap between the coating head and the object to be coated according to a preferred embodiment of the present invention.

FIG. 4 is a schematic diagram of a slot die position control system based upon feed-forward control where a coating roller 105 rotating in a clockwise manner supports a moving substrate 110. At multiple positions on the coating roller in advance of the application of the coating at the coating gap 106, substrate splices are sensed using a sensor 411 and substrate coating defects are sensed with a sensor 412. Signals indicative of such splices or defects are sent to a retract logic circuit 413 which determines what action should be taken. The appropriate action via a resultant signal is then sent to the feed-forward controller 414. The feed-forward controller 414 using a model of the coating process, essentially a transport delay, then sends a signal to a positioner (not shown) which retracts the coating head 107, part of the single unit 201, subsequently changing the coating gap 106 during the time that the splice or defect is in the coating gap 106. The directional arrow K indicates the axis of movement of the single unit 201.

Figure 5:
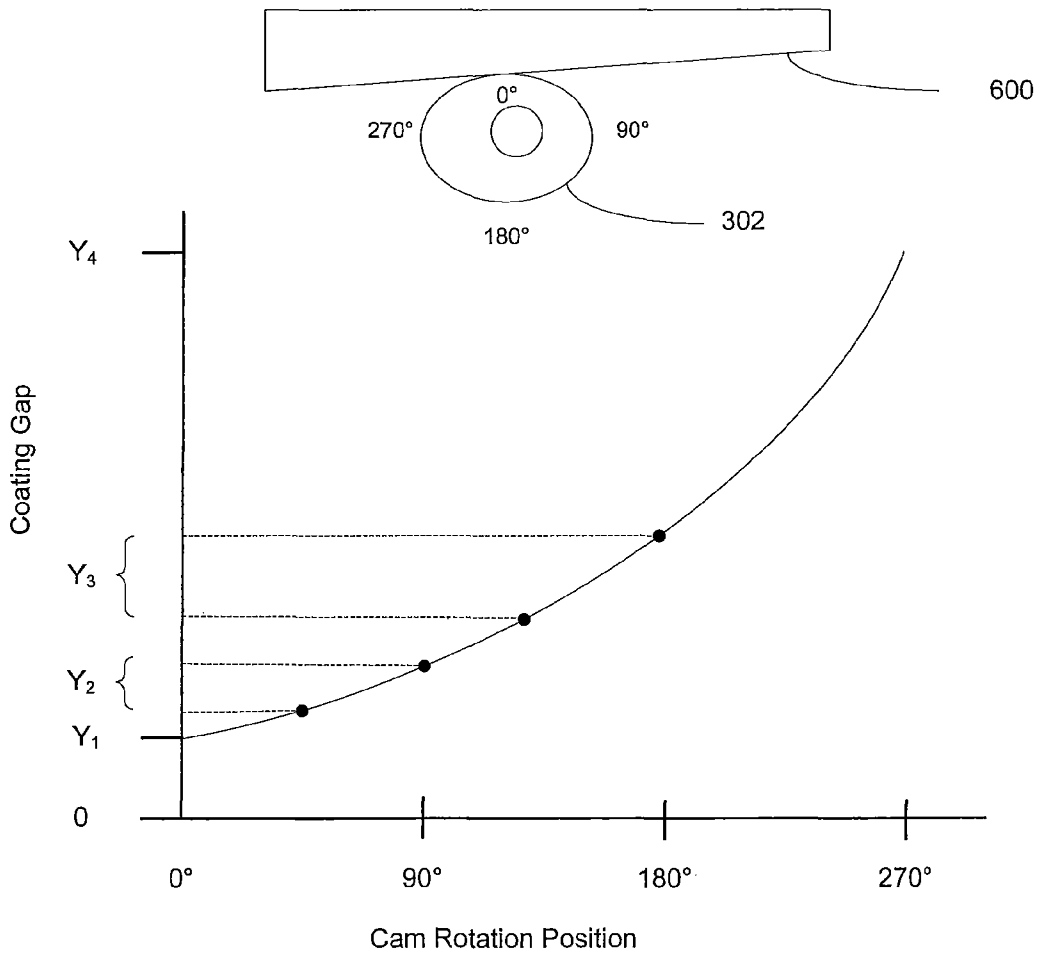
FIG. 5 is a graph of feed-forward controller inputs and outputs used in the control system according to a preferred embodiment of the present invention.

FIG. 5 is a graph of the feed-forward controller 414 operation depicting the relationship between the cam 302 rotation position and the associated coating gap 106. In the diagram above the graph, the wedge-shaped member 600 is shown abutting the cam 302 at the 12:00 or 0° position. The X-axis represents the degree of rotation of the cam as dictated by the feed-forward controller 414 output and the Y-axis represents the resulting coating gap 106. For coating bead pick up, the feed-forward controller rotates the cam 302 to the 12:00 or 0° position which has a fixed gap of $Y_1$. Once coating is established, the controller rotates the cam 302 to the nominal 3:00 or 90° position which has an adjustable coating gap as indicated by $Y_2$. Upon the detection of a splice in the web being coated, the feed-forward controller rotates the cam 302, during the appropriate interval, to the 6:00 or 180° position which increases the coating gap as indicated by $Y_3$ which is also adjustable. Upon the detection of a web defect, the feed-forward controller rotates the cam 302, during the appropriate interval, to the 9:00 or 270° position further increasing the coating gap to $Y_4$.

Figure 6:
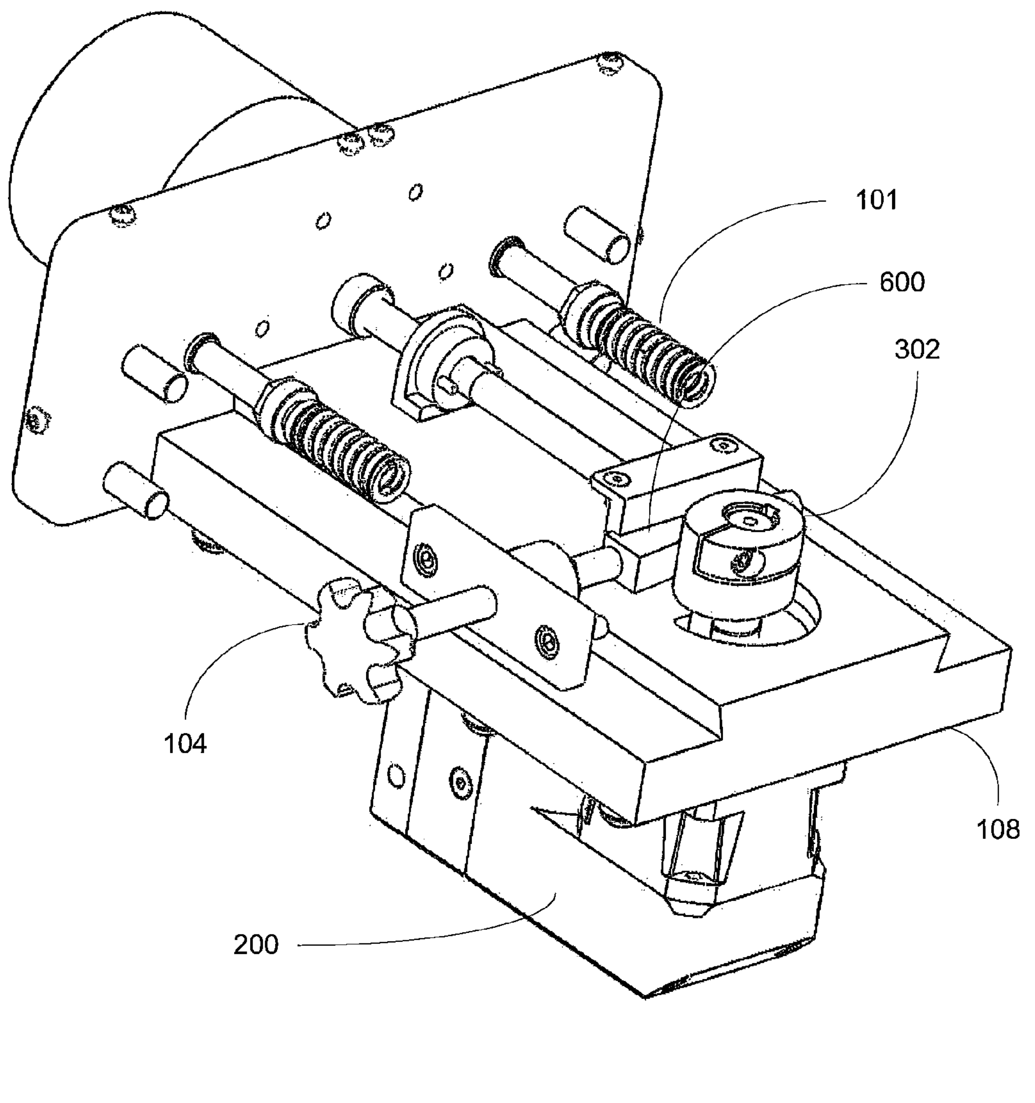
FIG. 6 is a more detailed three-dimensional view of the internal components including the cam and a wedge-shaped adjustment member according to a preferred embodiment of the present invention.

FIG. 6 is a view of internal components featuring the details of the cam 302 and its relationship to the wedge-shaped adjustment member 600.

FIGS. 7A and 7B are three-dimensional views of the details of a representative wedge-shaped adjustment member, the solid figure bounded by the points ABCDEFGH, and a representative tapered rod adjustment member, the solid frustum of a right cone X bounded by the circles Y and Z. The wedge-shaped adjustment member is supported by mounts (indicated, but not shown in FIG. 6) abutting the ACEG plane. The tapered rod adjustment member is supported by a shaft aligned with the central axis of the frustum connected to both sides of the machine tool slide 103 (as shown in FIG. 2).

Referring now to FIG. 1 in more detail, in the preferred embodiment of the herein described slot die coater, the plan view shows the coating head 107 is attached to the die mount 102. The die mount 102 in turn is positioned on the top of the die pivot 109 which is in turn placed upon the machine tool slide 103. The machine tool slide 103 is mounted into the side rail 108 which enables movement of the entire single unit 201 transversely either toward or away from the coating roller 105. The machine tool slide 103 is tensioned by springs 101 which provide a force that tends to move the machine tool slide 103 toward the coating roller 105. The coating gap 106 is maintained by the adjustment of the manual gap adjustment 104.

In FIG. 2, the side view shows the servomotor 200 mounted perpendicular to the axis of movement of the machine tool slide 103 and single unit 201 as indicted by 15 the arrow K.

In FIG. 3, the bottom view (where the servomotor 200 has been removed) shows the manual adjust 104 connected to a tapered rod 301 which is supported on both ends by the machine tool slide 103. While a tapered rod is shown and described, any wedge shape element that is able to manually positioned perpendicular to the axis of movement of the machine tool slide 103 and single unit 201 may be used. The tapered rod 301 impinges upon a cam 302 mounted on the shaft 202 of the servomotor 200. The cam 302 is held in tension against the tapered rod 301 by springs 101. This set up maintains the machine tool slide 103 under spring tension at a particular position. Rotation of the manual gap adjustment 104 causes the tapered rod 301 to move perpendicular to the axis of movement of the machine tool slide 103 and single unit 201 such that when the cam 302 is in a fixed position this rotation causes the coating gap 106 to increase or decrease by moving the machine slide 103 and single unit 201 backwards or forward.

In FIG. 4, a feed-forward control system is shown to maintain the coating gap 106 between the coating roller 105 and the coating head 107 plus implement slot die retraction when a substrate splice or defect is encountered. A substrate splice sensor 411 or alternatively a substrate defect sensor 412 monitors the substrate in advance of the substrate being located at the coating gap 106. Such sensors are well known in the art and may be either optical or electromechanical. The substrate height sensor(s) are preferably located at a position far enough in advance of the coating gap 106 such that there is adequate time for the control system to respond. When a splice or defect is sensed, a representative signal is sent to the retract logic circuit 413 which determines if a full retract is required (often the case for defects, but this action frequently breaks the coating bead) or if only a partial retract is required (which usually does not break the coating bead, allowing coating to continue uninterrupted). The appropriate signal is then sent to the feed-forward controller 414 which using the distance between the appropriate sensor (411 or 412) and the coating gap 106 coupled with the rotational speed of the coating roller 105 determines the transport lag of the substrate. The feed-forward controller 414 then times a signal to the servomotor 200 which results in the rotation of the servomotor shaft and attached cam 302 thereby increasing the coating gap 106 and safely moving the coating head 107 out of the way of the splice or defect during the time that the splice or defect is in the coating gap 106. In essence, the retract logic circuit 413 determines how far to retract the coating head 107 and the feed-forward controller 414 determines when to retract and when to return the coating head 107. An accurate transport lag model allows for the minimization of the amount of off-specification coated product which would be unsuitable for sale.

The apparatus achieves an accurate setup for the coating gap 106 by having the tapered rod 301 mounted into the spring 101 tensioned machine tool slide 103 upon which the die pivot 109, the die mount 102 and the coating head 107 are attached. The cam 302 mounted on the servomotor 200 shaft is placed such that the tapered rod 301 abuts the cam 302. When the cam 302 is in a fixed position, the rotation of the manual gap adjustment 104 causes the tapered rod 301 to move in a direction perpendicular to the axis of the tapered rod 301 subsequently increasing or decreasing the coating gap 106. In this preferred embodiment, a one degree rotation of the manual gap adjustment 104 moves the coating gap 106 about ten microns or ten-millionths of a meter (about 500 millionths of an inch). While subject to backlash, accurate setup of the coating gap 106 is obtained by simultaneous measurement of the coating gap while rotating the manual gap adjustment 104. This is a much more accurate means of obtaining the initial desired coating gap 106 than any practical leadscrew configuration.

The apparatus achieves web splice retraction coupled with a highly precise return of the machine tool slide 103 and single unit 201 to the prior coating gap 106 by using the servomotor to rotate the shaft holding the cam 302. Under spring 101 tension, the machine tool slide 103 (to which is attached the die pivot 109, die mount 102 and the coating head 107) moves very quickly in response to a rotation of the cam 302. Upon the sensing of the arrival of a web splice or defect or any other process disturbance requiring retraction of the machine tool slide 103 and single unit 201, the servomotor is engaged at the appropriate time to rotate the cam 302 to a predetermined position per the table in FIG. 5 thereby increasing the coating gap 106. Once a splice or defect is sensed, the feed-forward controller uses a model of the transport lag incorporating the rotational speed of the coating roller 105 and the position of the appropriate sensor, 411 or 412, to determine the timing as to when to retract and return the coating head 107. This increased coating gap 106 is maintained until the substrate splice or defect passes and then the servomotor rotates in the opposite direction returning the coating head 107 to its former coating position thus re-establishing the appropriate coating gap 106. Note that this retraction and repositioning is accomplished without backlash and, hence, can be accomplished with high precision. Furthermore, the splice retract position, as indicated by $Y_3$ in FIG. 5, is adjustable depending upon the specifics of an individual coating to help minimize the breakage of the coating bead. A retract logic circuit 413 operates on the signals from the substrate splice sensor 411 and the substrate defect sensor 412 to create an appropriate signal enabling the feed-forward controller 414 to partially retract the coating head 107 when a splice is encountered or fully retract the coating head 107 when a defect is encountered. Partial retraction is preferred as this action is less likely to upset the coating process and break the coating bead.

It will be apparent to those skilled in the art that various modifications and variations can be made to the methods and processes of this invention. Thus, it is intended that the present invention cover such modifications and variations, provided they come within the scope of the appended claims and their equivalents.

The disclosure of all publications cited above is expressly incorporated herein by reference in their entireties to the same extent as if each were incorporated by reference individually.

We claim:

1. A method of coating an object comprising the steps of:
- providing a coating apparatus comprising,
  - a support device that supports a moving object to be coated,
  - a coating head,
  - a first support supporting said coating head in a selected position, said first support movable along at least one axis,
  - an adjustment mechanism positioned to move the first support relative to the support device to adjust a coating gap between said coating head and said object to be coated,
  - a cam positioned to move the first support, and
  - a cam drive for providing rotation to the cam, wherein rotation of the cam adjusts the position of said coating head relative to said object to be coated;
  - a second support supporting the first support, wherein the first and seconds are movable with respect to each other along the at least one axis, wherein the cam drive is supported by the second support and is positioned to move the first support to adjust the gap, and
  - wherein the adjustment mechanism comprises a tapered or wedge-shaped adjustment member contacting and supported by said first support, the tapered or wedge shaped adjustment member being movable in a direction substantially perpendicular to the at least one axis, and
  - a drive mechanism to move the tapered or wedge-shaped adjustment member to adjust the first support relative to the second support;
- actuating the adjustment mechanism to set the coating gap between the coating head and the object to be coated, said coating head being in a coating position;
- applying at least one coating layer onto said moving object to be coated with said coating head;
- actuating the cam drive to rotate the cam whereby rotation of the cam against the first support moves the coating head in a direction away from the object being coated; and
- actuating the cam drive to return the coating head to said coating position.

2. A method as claimed in claim 1, further comprising the steps of:
- providing at least one sensor to detect a splice or defect in the object being coated said sensor being in electrical communication with the cam drive;
- detecting a splice or defect in the object being coated;
- actuating the cam drive in response to the sensor to rotate the cam, whereby rotation of the cam moves the coating head in a direction away from the object being coated; and
- actuating the cam drive to return the coating head to said coating position after said splice or defect has passed.

3. The method of claim 1, wherein said moving object is a continuous web.

4. The method of claim 2, wherein sensing said splice or defect employs an optical sensor.

5. The method of claim 2, wherein sensing said splice or defect employs an electromechanical sensor.

* * * * *